United States Patent
Granot (10) Patent No.: US 11,521,874 B2
(45) Date of Patent: Dec. 6, 2022

(54) SYSTEMS AND METHODS FOR DETERMINING MEASUREMENT LOCATION IN SEMICONDUCTOR WAFER METROLOGY

(71) Applicant: KLA Corporation, Milpitas, CA (US)

(72) Inventor: Asaf Granot, Lotem (IL)

(73) Assignee: KLA Corporation, Milpitas, CA (US)

( * ) Notice: Subject to any disclaimer, the term of this patent is extended or adjusted under 35 U.S.C. 154(b) by 149 days.

(21) Appl. No.: 17/148,549

(22) Filed: Jan. 13, 2021

(65) Prior Publication Data
US 2022/0102174 A1 Mar. 31, 2022

Related U.S. Application Data (60) Provisional application No. 63/086,019, filed on Sep. 30, 2020.

(51) Int. Cl.
*G06K 9/00* (2022.01)
*H01L 21/67* (2006.01)
*G06T 7/00* (2017.01)

(52) U.S. Cl.
CPC ........ *H01L 21/67288* (2013.01); *G06T 7/001* (2013.01); *G06T 2207/20081* (2013.01); *G06T 2207/30148* (2013.01)

(58) Field of Classification Search
CPC ............... H01L 21/67288; G06T 7/001; G06T 2207/20081; G06T 2207/30148
See application file for complete search history.

(56) References Cited

U.S. PATENT DOCUMENTS

| | | | |
|---|---|---|---|
| 10,068,786 B1* | 9/2018 | Boduch | H01L 21/67288 |
| 10,664,638 B1* | 5/2020 | Kagalwala | H01L 22/20 |
| 2012/0212749 A1 | 8/2012 | Den Boef et al. | |
| 2014/0270469 A1* | 9/2014 | Rotem | G03F 7/70633 382/145 |
| 2016/0327605 A1* | 11/2016 | Pandev | H01L 22/20 |
| 2016/0334205 A1* | 11/2016 | Aiyer | G01B 11/0675 |
| 2017/0061604 A1* | 3/2017 | Pandev | G06V 20/66 |
| 2017/0287754 A1 | 10/2017 | Nabeth et al. | |
| 2017/0299376 A1 | 10/2017 | Fresquet | |

(Continued)

OTHER PUBLICATIONS

WIPO, International Search Report for International Application No. PCT/US2021/016494, dated Jun. 30, 2021.

*Primary Examiner* — Samir A Ahmed
(74) *Attorney, Agent, or Firm* — Hodgson Russ LLP (57) ABSTRACT

A system and method for generating a quality metric relating to a fully or partially fabricated semiconductor device wafer (FPFSDW), the method including providing a spot map correlating a plurality of reference field images (RFIs) to a corresponding plurality of reference spot locations (RSLs) on at least one reference structure formed on a reference semiconductor device wafer, taking a measurement of at least a portion of at least one FPFSDW structure formed on the FPFSDW, thereby generating a measurement field image (MFI) of at least a portion of the at least one FPFSDW structure and a pupil image of the at least a portion of the at least one FPFSDW structure, identifying, for the measurement, a measurement spot location (MSL) on the at least one FPFSDW structure, using the MFI and the spot map, and generating a quality metric of the FPFSDW, using the pupil image and the MSL.

25 Claims, 7 Drawing Sheets

(56) References Cited

U.S. PATENT DOCUMENTS

| | | |
|---|---|---|
| 2018/0301385 A1 | 10/2018 | Ittah et al. |
| 2020/0243400 A1 | 7/2020 | Wang et al. |
| 2020/0271596 A1* | 8/2020 | Volkovich .......... G01N 21/9501 |
| 2020/0409345 A1* | 12/2020 | Kagalwala ....... G05B 19/41875 |

* cited by examiner

SYSTEMS AND METHODS FOR DETERMINING MEASUREMENT LOCATION IN SEMICONDUCTOR WAFER METROLOGY

REFERENCE TO RELATED APPLICATIONS

Reference is hereby made to U.S. Provisional Patent Application Ser. No. 63/086,019, filed Sep. 30, 2020 and entitled MICRO-NAVIGATION FEEDBACK VIA SPOT SHAPE, the disclosure of which is hereby incorporated by reference and priority of which is hereby claimed.

FIELD OF THE INVENTION

The present invention relates to measurement of quality metrics in the manufacture of semiconductor devices generally.

BACKGROUND OF THE INVENTION

Various methods and systems are known for measurement of quality metrics in the manufacture of semiconductor devices.

SUMMARY OF THE INVENTION

The present invention seeks to provide improved methods and systems for measurement of quality metrics in the manufacture of semiconductor devices.

There is thus provided in accordance with a preferred embodiment of the present invention a method for generating a quality metric relating to a fully or partially fabricated semiconductor device wafer (FPFSDW), the method including providing a spot map correlating a plurality of reference field images (RFIs) to a corresponding plurality of reference spot locations (RSLs) on at least one reference structure formed on a reference semiconductor device wafer, taking a measurement of at least a portion of at least one FPFSDW structure formed on the FPFSDW, thereby generating a measurement field image (MFI) of at least a portion of the at least one FPFSDW structure and a pupil image of the at least a portion of the at least one FPFSDW structure, identifying, for the measurement, a measurement spot location (MSL) on the at least one FPFSDW structure, using the MFI and the spot map, and generating a quality metric of the FPFSDW, using the pupil image and the MSL.

In accordance with a preferred embodiment of the present invention, the quality metric includes an indication of misregistration between at least two layers formed on the FPFSDW.

Preferably, the providing the spot map includes, for each of a plurality of locations on the at least one reference structure, generating an RFI from a first measurement of the at least one reference structure using a first radiation source, the RFI being one of the plurality of RFIs, generating a training field image (TFI) from a second measurement of the at least one reference structure using a second radiation source and identifying, based on the TFI, a corresponding RSL on the at least one reference structure, the corresponding RSL being one of the plurality of RSLs, and populating the spot map by associating the corresponding RSL with the RFI.

In accordance with a preferred embodiment of the present invention, the first radiation source provides generally coherent radiation and the second radiation source provides generally incoherent radiation.

Preferably, the generating the MFI includes using a dedicated target acquisition receptor.

In a preferred embodiment of the present invention, the generating the MFI includes using a pupil receptor and at least one pupil image-to-field image optical component.

Preferably, if the MSL does not include a suitable spot location, the method also includes, prior to the generating the quality metric, taking an additional measurement of at least a portion of the at least one FPFSDW structure, thereby generating an additional MFI of at least a portion of the at least one FPFSDW structure and an additional pupil image of the at least a portion of the at least one FPFSDW structure, and identifying, for the additional measurement, an additional MSL on the at least one FPFSDW structure, using the additional MFI and the spot map.

In a preferred embodiment of the present invention, the at least one FPFSDW structure includes a plurality of periodic structures being periodic along an axis of periodicity, and each of the RSLs and the MSL indicates a distance in a direction generally parallel to the axis of periodicity.

In accordance with a preferred embodiment of the present invention, the method also includes using the quality metric in a fabrication process of at least one semiconductor device wafer.

There is also provided in accordance with another preferred embodiment of the present invention a system for use with a metrology tool operative to measure a fully or partially fabricated semiconductor device wafer (FPFSDW), the system including a spot map generator operative to generate a spot map correlating a plurality of reference field images (RFIs) to a corresponding plurality of reference spot locations (RSLs) on at least one reference structure formed on a reference semiconductor device wafer and a field image-location mapping engine (FILME) operative to correlate each of a plurality of measurement field images (MFIs) with a corresponding measurement spot location (MSL) on at least one FPFSDW structure formed on the FPFSDW, using the spot map.

In a preferred embodiment of the present invention, each of the plurality MFIs is generated using a source of generally coherent radiation.

There is further provided in accordance with yet another preferred embodiment of the present invention a system for measuring a fully or partially fabricated semiconductor device wafer (FPFSDW), the system including a metrology tool including a first radiation source and a second radiation source, a spot map generator operative to populate a spot map correlating a plurality of reference field images (RFIs) to a corresponding plurality of reference spot locations (RSLs) on at least one reference structure formed on a reference semiconductor device wafer and a field image-location mapping engine (FILME) operative to correlate each of a plurality of measurement field images (MFIs) with a corresponding measurement spot location (MSL) on at least one FPFSDW structure formed on the FPFSDW, using the spot map.

Preferably, the metrology tool further includes a first radiation receptor, operative to capture a pupil image, and a second radiation receptor, operative to capture a field image.

In accordance with a preferred embodiment of the present invention, the second radiation receptor includes a dedicated target acquisition receptor.

Alternatively, in accordance with a preferred embodiment of the present invention, the second radiation receptor includes a pupil receptor. Preferably, the metrology tool further includes at least one pupil image-to-field image optical component.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

It is appreciated that the system and method described hereinbelow with reference to FIGS. 1A-6 are preferably used to measure semiconductor devices and generate quality metrics therefor, such as indications of misregistration between different layers of semiconductor devices, and are part of a manufacturing process for semiconductor devices. The quality metrics generated by the system and method described hereinbelow with reference to FIGS. 1A-6 are preferably used to adjust fabrication processes, such as lithography, during the manufacturing of semiconductor devices, to ameliorate the semiconductor devices being fabricated, for example, to ameliorate misregistration between various layers of semiconductor devices.

In order to maintain desired characteristics of structures formed on a semiconductor device wafer, including the spatial registration of the various layers of the semiconductor devices being formed thereon, quality metrics, such as misregistration and a shape or dimension of structures formed on the semiconductor device wafer, are typically measured multiple times throughout a fabrication process of the semiconductor devices. Typically, data generated from measurements taken of the semiconductor device wafer includes a spot location. The spot location is a location on which a beam of incident radiation used in a metrology measurement impinges, and the spot location is typically a location that is relative to a structure or set of structures formed on the semiconductor wafer being measured.

In order to improve the quality and utility of the metrology measurements, it is preferable to provide the spot location with an accuracy of greater than 30 nm, more preferably greater than 20 nm, even more preferably greater than 15 nm and most preferably greater than 10 nm. The present invention seeks to provide a spot location having an accuracy of greater than 30 nm, more preferably greater than 20 nm, even more preferably greater than 15 nm and most preferably greater than 10 nm.

Specifically, in the present invention, locations of one or more characteristic features within a field image are correlated to a spot location on at least one reference structure being measured by a metrology tool. In a preferred embodiment of the present invention, the metrology tool preferably provides generally a single beam of generally coherent incident radiation, such as laser light, to measure structures formed on the semiconductor wafer. Preferably, the metrology tool generates both a field image and a pupil image from the generally a single beam of generally coherent incident radiation. As is known in the art, taking multiple measurements is typically a time-consuming process that impacts fabrication throughput, reducing a number of semiconductor devices that can be fabricated in a given amount of time. Therefore, generating both the field image and the pupil image from a generally single beam of incident radiation is advantageous, particularly as a way to minimize an impact of the metrology measurement on fabrication throughput. Additionally, by generating both a field image and a pupil image from the generally a single beam of incident radiation, the present invention provides a highly accurate value for the spot location used to generate the pupil image.

Preferably, the field image is used to generate the spot location, and the pupil image is used to generate the quality metric. In a preferred embodiment of the present invention, the spot location is also used in the generation of the quality metric, since the quality metric generated from a measurement is specific to the area of the semiconductor device wafer which is measured by the measurement, and the spot location indicates the area of the semiconductor device wafer which is measured by the measurement.

Figure 1A:
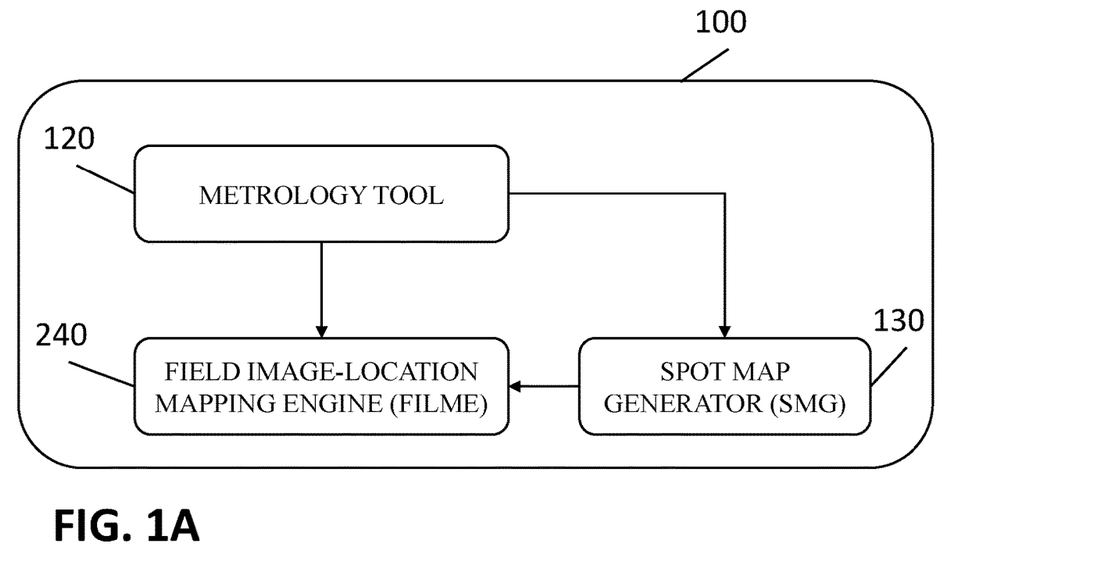
FIG. 1A is a simplified schematic diagram of a first embodiment of a metrology system including a metrology tool.
Figure 1B:
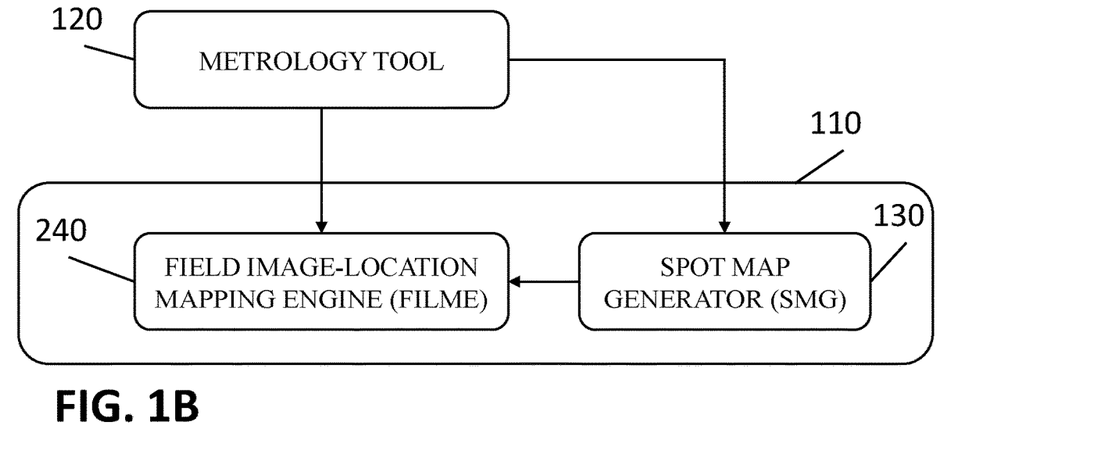
FIG. 1B is simplified schematic diagram of a second embodiment of a metrology system for use with a metrology tool.
Figure 2A:
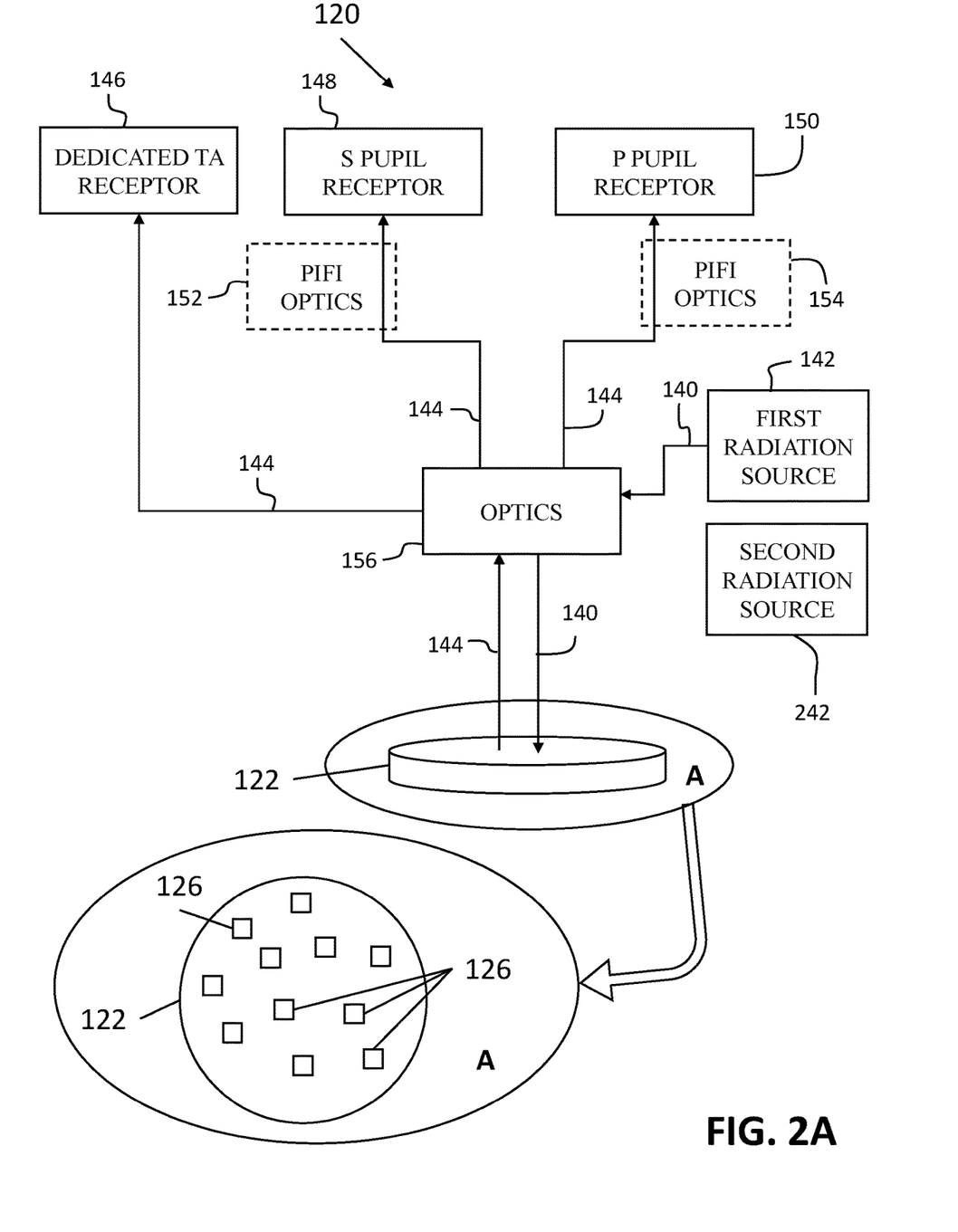
FIG. 2A is a simplified schematic diagram of a portion of the metrology tool of FIGS. 1A & 1B in a first use case.
Figure 2B:
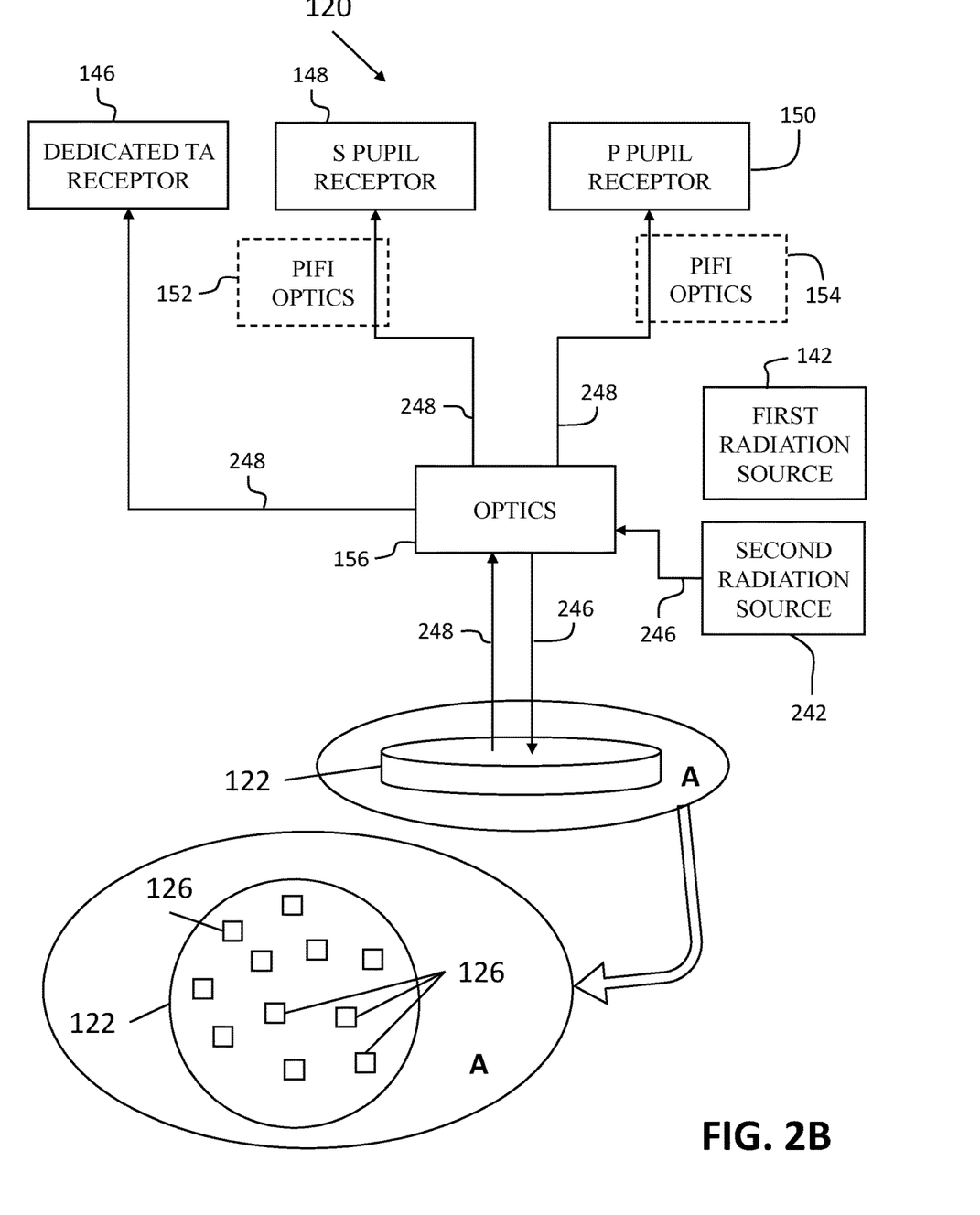
FIG. 2B is a simplified schematic diagram of a portion of the metrology tool of FIGS. 1A & 1B in a second use case.
Figure 3A:
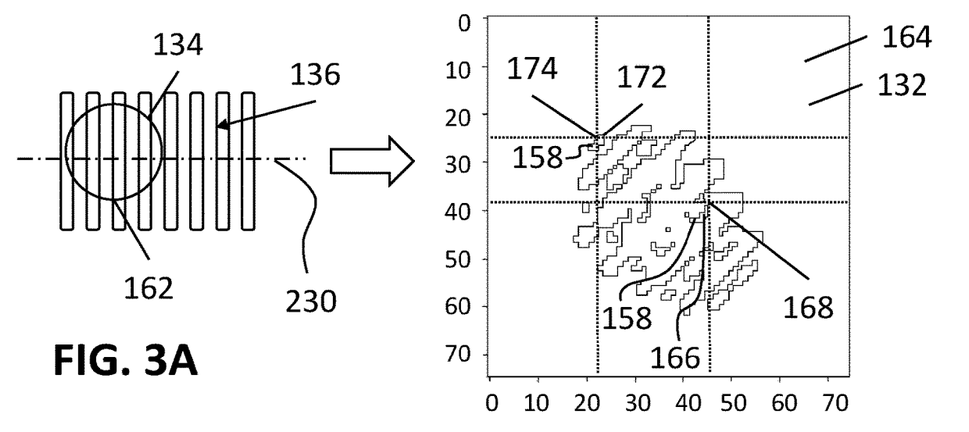
FIGS. 3A, 3B and 3C are simplified illustrations of respective first, second and third spot locations on a set of reference structures and corresponding field images generated by the metrology tool of FIGS. 1A-2B.
Figure 3B:
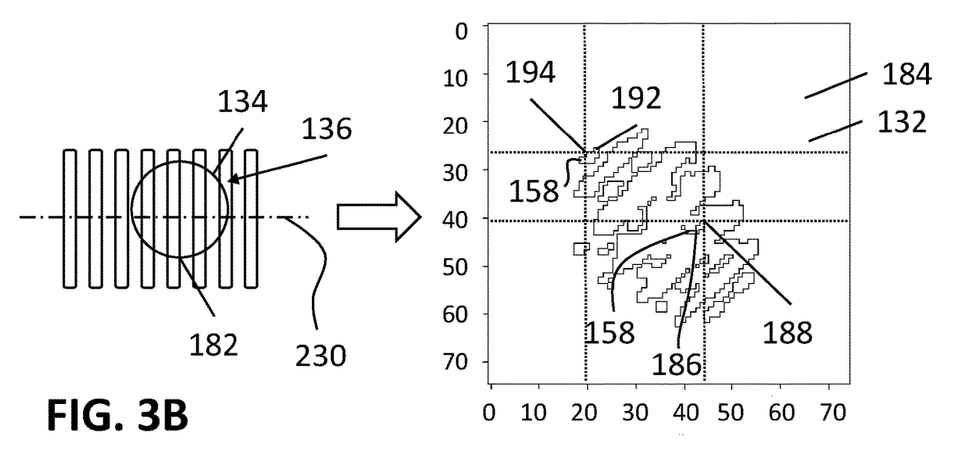
Figure 3C:
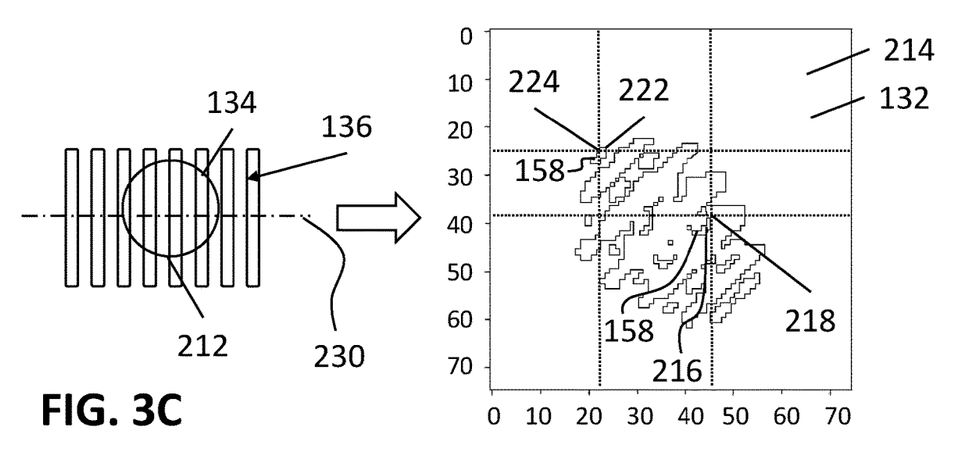
Figure 4A:
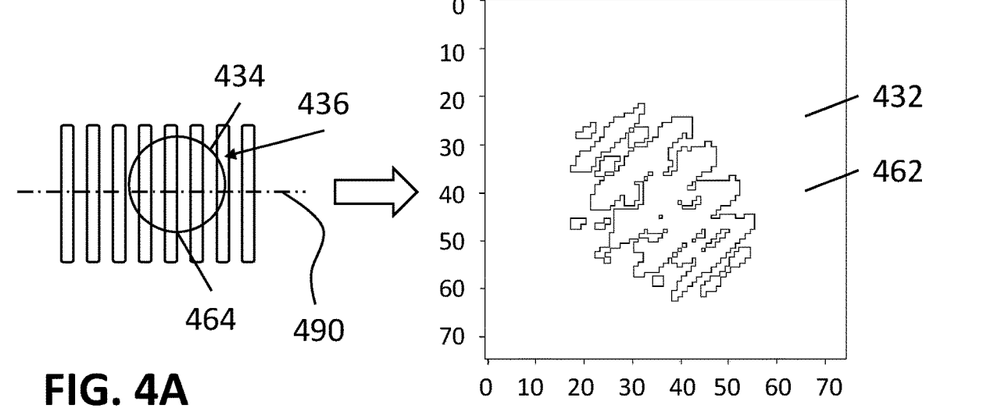
FIGS. 4A, 4B and 4C are simplified illustrations of respective first, second and third spot locations on a set of measurement structures and corresponding field images generated by the metrology tool of FIGS. 1A-2B.
Figure 4B:
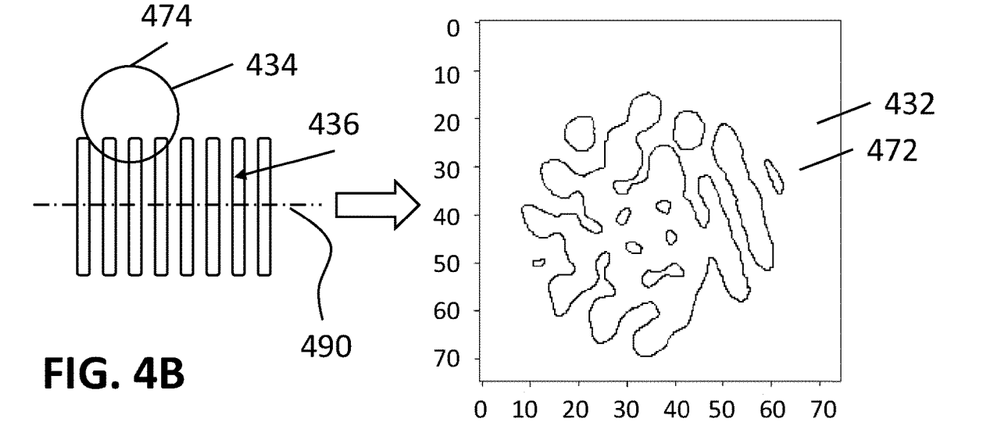
Figure 4C:
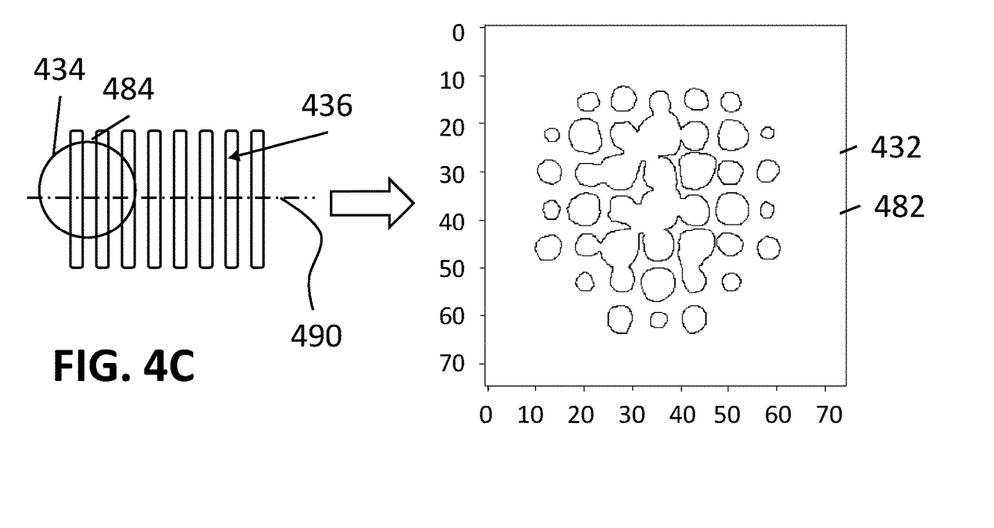

Reference is now made to FIG. 1A, which is a simplified schematic diagram of a first embodiment of a metrology system 100 including a metrology tool 120, to FIG. 1B, which is simplified schematic diagram of a second embodiment of a metrology system 110 for use with metrology tool 120, to FIGS. 2A & 2B, which are simplified schematic diagrams of a portion of metrology tool 120 in respective first and second use cases, to FIGS. 3A-3C, which are simplified illustrations of respective first, second and third spot locations on a set of reference structures and corresponding field images generated by metrology tool 120, and to FIGS. 4A-4C which are first, second and third simplified illustrations of respective first, second and third spot locations on a set of measurement structures and corresponding field images generated by metrology tool 120.

It is appreciated that, for ease of understanding, FIGS. 1A-4C are not drawn to scale. It is further appreciated that the embodiments shown in FIGS. 1A & 1B differ in that system 100 includes metrology tool 120 in the embodiment illustrated in FIG. 1A, while in the embodiment illustrated in FIG. 1B, system 110 is separate from and communicates with metrology tool 120. Additionally, while the field images generated by metrology tool 120 are typically embodied as gray level intensity images, the field images shown in FIGS. 3A-4C are represented by line drawings.

Metrology tool 120 may be any suitable metrology tool, most preferably a metrology tool that employs generally coherent radiation, such as light output by a laser, to generate measurement output signals. A typical metrology tool suitable for use as metrology tool 120 is an ATL™ 100 or a SpectraShape™ 11k, both of which are commercially available from KLA Corporation of Milpitas, Calif., USA.

Metrology tool 120 is preferably operative to measure a quality metric of a semiconductor device wafer (SDW) 122, such as misregistration between at least two layers formed on SDW 122 or at least one of a shape or dimension of at least one structure formed on SDW 122. It is appreciated that SDW 122 is preferably embodied as a reference semiconductor device wafer (RSDW) or a fully or partially fabricated semiconductor device wafer (FPFSDW).

It is further appreciated that in one embodiment of the present invention, each of the RSDWs and the FPFSDWs are part of a single batch or design of wafers, all of which undergo the same fabrication steps and include semiconductor devices which are intended to be identical to corresponding semiconductor devices on all other SDWs 122 in the single batch or design of wafers.

In another embodiment of the present invention, each of the RSDWs and the FPFSDWs are part of a single batch or design of wafer, but at least one SDW 122, most typically an RSDW, in the single batch or design of wafers is intentionally fabricated differently than other SDWs 122 in the single batch or design of wafers, typically as a design of experiment (DOE) wafer, which is fabricated using parameters that intentionally vary from other SDWs 122 in the single batch or design of wafers.

As seen particularly in enlargement circle A in each of FIGS. 2A & 2B, metrology tool 120 preferably measures a plurality of measurement sites 126 on one or more SDWs 122. It is appreciated that measurement sites 126 may have any suitable shape and dimension. Similarly, SDW 122 may have any suitable number of measurement sites 126 having any suitable distribution thereupon. In one embodiment of the present invention, at least some of measurement sites 126 are intended to be identical or nearly identical to one another. In another embodiment of the present invention, at least some of measurement sites 126 intentionally differ from each other.

It is appreciated that each metrology measurement taken by metrology tool 120 preferably includes measuring a particular measurement site 126, thereby generating metrology measurement data relating to measurement site 126, and analyzing the misregistration measurement data generated by metrology tool 120, thereby generating at least one quality metric of measurement site 126. In a preferred embodiment of the present invention, the quality metric is an indication of misregistration between at least two layers formed on FPFSDW 122, particularly a misregistration value for the layers between which misregistration was measured at measurement site 126. In an additional preferred embodiment of the present invention, the quality metric indicates at least one of a dimension or a shape of one or more structures formed within measurement site 126.

As seen particularly in FIGS. 1A & 1B, each of system 100 and system 110 preferably includes a spot map generator (SMG) 130, operative to generate a spot map, the spot map correlating a plurality of reference field images (RFIs) 132 to a corresponding plurality of reference spot locations (RSLs) 134 on at least one reference structure 136 formed on RSDW 122. It is appreciated that each measurement site 126 may include any number, shape, size and arrangement of reference structures 136.

As seen particularly in FIG. 2A, metrology tool 120 preferably uses incident radiation 140 provided by a first radiation source 142 to measure RSDW 122, thereby generating RFIs 132. In a preferred embodiment of the present invention, first radiation source provides generally coherent incident radiation 140, such as laser light. It is appreciated that incident radiation 140 is preferably incident upon RSDW 122 and is also reflected by RSDW 122. After being reflected by RSDW 122, incident radiation 140 is referred to herein as reflected radiation 144.

In one embodiment of the present invention, plurality of RFIs 132 is generated by reflected radiation 144 collected by a dedicated target acquisition (TA) receptor 146, which is typically adjusted to collect field images of SDW 122. In an alternative embodiment of the present invention, plurality of RFIs 132 is generated by reflected radiation 144 collected by an S pupil receptor 148. In yet another alternative embodiment of the present invention, plurality of RFIs 132 is generated by reflected radiation 144 collected by a P pupil receptor 150.

It is appreciated that in typical use cases of metrology tool 120, S pupil receptor 148 and P pupil receptor 150 collect pupil images, and not field images, of SDW 122. In the embodiments described hereinabove wherein S pupil receptor 148 or P pupil receptor 150 is used to collect reflected radiation 144 to generate RFIs 132, metrology tool 120 preferably includes at least one pupil image-to-field image (PIFI) optical component 152 or 154, respectively, such as a lens, disposed such that reflected radiation 144 passes through PIFI optical component 152 or 154 before being collected by S pupil receptor 148 or P pupil receptor 150, respectively.

Preferably, PIFI optical component 152 has two operative orientations, an engaged operative orientation and a disengaged operative orientation, so S pupil receptor 148 collects radiation to generate a field image or a pupil image, respectively. Similarly, PIFI optical component 154 preferably has two operative orientations, an engaged operative orientation and a disengaged operative orientation, so P pupil receptor 150 collects radiation to generate a field image or a pupil image, respectively.

In a preferred embodiment of the present invention, metrology tool 120 further includes additional optical components 156, at least some of which are operative to direct incident radiation 140 and reflected radiation 144 as desired.

As described hereinabove, and as seen particularly in FIGS. 3A-4C, generally coherent incident radiation 140 is incident on a particular area of measurement site 126, referred to herein as a spot location, such as RSL 134. It is appreciated that the particular area impinged upon by incident radiation 140 may have any suitable shape and size relative to reference structures 136.

As additionally seen in FIGS. 3A-3C, RFIs 132 preferably include at least one characteristic feature 158. It is appreciated that a location of at least one characteristic feature 158 within RFI 132 shifts as a function of RSL 134 on at least one reference structure 136.

By way of example, RSL 134 shown in FIG. 3A is embodied as an RSL 162, which is located in a generally leftward area of reference structures 136, and a corresponding RFI 164 includes characteristic features 158, such as a characteristic feature 166 at a location 168 and a characteristic feature 172 at a location 174. As seen in FIG. 3A, in the example illustrated therein, location 168 has a value along a vertical axis of slightly less than 40 pixels. Similarly, location 174 has a value along a horizontal axis of slightly greater than 20 pixels.

In contrast, in the example shown in FIG. 3B, RSL 134 is embodied as an RSL 182, which is located in a generally rightward area of reference structures 136, and a corresponding RFI 184 includes characteristic features 158, such as a characteristic feature 186 at a location 188 and a characteristic feature 192 at a location 194. As seen in FIG. 3B, in the example illustrated therein, location 188 has a value along a vertical axis of slightly greater than 40 pixels. Similarly, location 194 has a value along a horizontal axis of slightly less than 20 pixels.

It is appreciated that although locations 168 and 188 are different, characteristic feature 166 and characteristic feature 186 are recognizable as being the same characteristic feature. Similarly, locations 174 and 194 are different, while characteristic feature 172 and characteristic feature 194 are recognizable as being the same characteristic feature.

In the example shown in FIG. 3C, RSL 134 is embodied as an RSL 212, which is located in a generally central area of reference structures 136, and a corresponding RFI 214, which is generally identical to RFI 164 shown in FIG. 3A, includes characteristic features 158, such as a characteristic feature 216 at a location 218 and a characteristic feature 222 at a location 224. It is noted that although RSLs 162 and 212 are different, locations 166 and 216 of respective characteristic features 168 and 218 are generally identical, as are locations 174 and 224 of respective characteristic features 172 and 222.

It is appreciated that in the embodiments illustrated in FIGS. 3A-3C, reference structures 136 include a plurality of periodic structures, which are periodic along an axis of periodicity 230. It is further appreciated that while RSL 162 of FIG. 3A and RSL 212 of FIG. 3C have different locations on reference structures 136, RSL 162 and RSL 212 each appear at the same point of periodicity of reference structures 136. This periodic commonality between RSL 162 and RSL 212 results in the strong similarity between RFI 164 and RFI 214.

Similarly, the spot map of the present invention preferably groups together multiple RSLs 134 which have a single position along an axis generally parallel to axis of periodicity 230, and which have different positions along an axis generally perpendicular to axis of periodicity 230. Thus, multiple RSLs 134 which differ in position only along an axis generally perpendicular to axis of periodicity 230, but which share a position along an axis generally parallel to axis of periodicity 230, are all mapped by SMG 130 to a single spot location, if each RSL 134 in such a set of RSLs 134 does not extend until or beyond edges of reference structures 136.

In addition to RFI 132, for each RSL 134, a training field image (TFI) (not shown) is generated. Typically, RFIs 132 are characterized by a first resolution or resolutions and the TFIs are characterized by a second resolution or resolutions, where the second resolution or resolutions are of a better quality than the first resolution or resolutions.

Preferably, the TFI is generated by metrology tool 120 while metrology tool 120 and SDW 122 are in the same relative position as for the generation of RFI 132. Most preferably, for each RSL 134, RFI 132 and the TFI are generated consecutively. It is a particular feature of the present invention that RFI 132 is preferably generated from a measurement taken using incident radiation 140 from first radiation source 142, and the TFI is preferably generated from a measurement taken using a second radiation source 242. Preferably, second radiation source 242 provides generally incoherent incident radiation 246, such as light from one or more light-emitting diodes (LEDs). It is appreciated that incident radiation 246 is preferably incident upon RSDW 122 and is also reflected by RSDW 122. After being reflected by RSDW 122, incident radiation 246 is referred to herein as reflected radiation 248.

As seen particularly in FIG. 2B, in one embodiment of the present invention, the TFIs are generated by reflected radiation 248 collected by dedicated TA receptor 146. In an alternative embodiment of the present invention, the TFIs are generated by reflected radiation 248 collected by S pupil receptor 148. In yet another alternative embodiment of the present invention, the TFIs are generated by reflected radiation 248 collected by P pupil receptor 150.

In an embodiment wherein S pupil receptor 148 or P pupil receptor 150 is used to collect reflected radiation 248 to generate the TFIs, metrology tool 120 preferably includes at least one PIFI optical component 152 or 154, respectively, such as a lens, disposed such that reflected radiation 248 passes through PIFI optical component 152 or 154 before being collected by S pupil receptor 148 or P pupil receptor 150, respectively. It is further appreciated that at least some of optical components 156 preferably direct incident radiation 246 and reflected radiation 248 as desired.

Preferably, SMG 130 populates the spot map by, for each of the plurality of RSLs 134 on at least one reference structure 136, receiving RFI 132 from a first measurement of the at least one reference structure 136 using first radiation source 142 and receiving the TFI from a second measurement of the at least one reference structure 136 using second radiation source 242. SMG 130 preferably identifies, at least partially based on the TFI, a corresponding RSL 134 on at least one reference structure 136, and then populates the spot map by associating the corresponding RSL 134 with the RFI 132.

The spot map may be populated using any suitable method, including, inter alia, image processing and supervised or unsupervised machine learning. Examples of such suitable methods include, but are not limited to, blob detection, pattern recognition and non-linear image registration.

In a preferred embodiment of the present invention, metrology tool 120 measures RSDW 122 during a dedicated training procedure, during which corresponding RFIs 132 and TFIs are generated for a plurality of RSLs 134 on reference structures 136. Then, a relatively high-accuracy value for RSL 134 is generated for each of the TFIs, and that value for RSL 134 is taken to be the corresponding RSL 134 for the corresponding RFI 132, and the spot map is populated thereby.

Preferably, the spot map includes all suitable RSLs 134 for reference structures 136 at measurement site 126. It is appreciated that for any set of RSLs 134 within a given range, the given range being preferably less than 30 nm, more preferably less than 20 nm, even more preferably less than 15 nm and most preferably less than 10 nm, the RFIs 132 of a corresponding set of RFIs 132 are generally indistinguishable from one another. Therefore, to include all suitable RSLs 134 in the spot map, a total length of reference structures 136 is preferably divided by the given range, producing a multiplicity of resulting regions, and metrology tool 120 preferably measures at least one RSL 134 in each of the resulting regions. Thus, it is appreciated that metrology tool 120 takes a finite number of measurements in order for SMG 130 to generate a spot map containing every possible suitable RFI 132 for reference structures 136.

Each of system 100 and system 110 preferably further includes a field image-location mapping engine (FILME) 240 operative to correlate each of a plurality of measurement field images (MFIs) 432 with a corresponding measurement spot location (MSL) 434 on at least one FPFSDW structure 436 formed on FPFSDW 122, using the spot map generated by SMG 130. Preferably, FILME 240 correlates MFIs 432 with MSLs 434 by matching each MFI 432 with a corresponding RFI 132 from the spot map generated by SMG 230. Thereupon, FILME 240 preferably retrieves from the spot map a value of corresponding RSL 134 for that RFI 132, and identifies that value of RSL 134 as a suitable value for the MSL 434 corresponding to that MFI 432.

Components of the system 100 or system 110, such as the FILME 240 or the SMG 130, can operate using a processor. The processor can be coupled to components of the system 100, system 110, or metrology tool 120 in any suitable manner to receive output. The processor may be configured to perform a number of functions using the output. The processor can be configured according to any of the embodiments described herein. The processor may be implemented in practice by any combination of hardware, software, and firmware. Also, its functions as described herein may be performed by one unit, or divided up among different components, each of which may be implemented in turn by any combination of hardware, software and firmware. Program code or instructions for the processor to implement various methods and functions may be stored in readable storage media.

The FILME 240, the SMG 130, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

For example, MFI 432 shown in FIG. 4A is embodied as an MFI 462, which is preferably matched by FILME 240 with corresponding RFI 184, shown in FIG. 3B, from the spot map generated by SMG 130. Thereafter, FILME 240 preferably additionally retrieves from the spot map the corresponding RSL 182 for RFI 184, and identifies the value of RSL 182 as a suitable value for MSL 464 corresponding to MFI 462.

Preferably, if FILME 240 cannot match one of MFIs 132 to an RFI 132 in the spot map, the MFI 132 is determined to be associated with an unsuitable MSL 434, and the results of that measurement are flagged. Thereafter, a user preferably decides if the flagged results are to be disregarded or weighted, and if the measurement of the unsuitable MSL 434 is to be repeated.

For example, MFI 432 shown in FIG. 4B is embodied as an MFI 472, which preferably is not matched by FILME 240 with a corresponding RFI 132 in the spot map generated by SMG 130. Therefore, MFI 472 is preferably determined to be associated with an unsuitable MSL 434, such as MSL 474, and the results of the measurement which generated MFI 472 are flagged for user follow-up.

Similarly, MFI 432 shown in FIG. 4C is embodied as an MFI 482, which preferably is not matched by FILME 240 with a corresponding RFI 132 in the spot map generated by SMG 130. Therefore, MFI 482 is preferably determined to be associated with an unsuitable MSL 434, such as MSL 484, and the results of the measurement which generated MFI 482 are flagged for user follow-up.

It is appreciated that FPFSDW structures 436 include a plurality of periodic structures which are periodic along an axis of periodicity 490, which corresponds to axis of periodicity 230 in FIGS. 3A-3C. It is appreciated that in a preferred embodiment of the present invention, each of RSLs 134 and MSLs 434 indicates a distance in a direction generally parallel to axis of periodicity 230 or 490.

In an additional embodiment of the present invention, such as in the example shown in FIG. 4B, MSL 434 indicates a distance in a direction generally perpendicular to axis of periodicity 490. More particularly, MSL 434 indicates that the particular area impinged upon by incident radiation 140 is not fully contained within FPFSDW structures 436.

In a preferred embodiment of the present invention, plurality of MFIs 432 is generated by respective measurements of FPFSDW 122 taken under illumination by first radiation source 142. More particularly, MFIs 432 are preferably generated under the same conditions under which RFIs 132 are generated.

Thus, if RFIs 132 are generated by reflected radiation 144 collected by dedicated TA receptor 146, then MFIs 432 are also generated by reflected radiation 144 collected by dedicated TA receptor 146. Similarly, if RFIs 132 are generated by reflected radiation 144 collected by S pupil receptor 148, then MFIs 432 are also generated by reflected radiation 144 collected by dedicated S pupil receptor 148. Additionally, if RFIs 132 are generated by reflected radiation 144 collected by P pupil receptor 150, then MFIs 432 are also generated by reflected radiation 144 collected by dedicated S pupil receptor 148. Similarly, if PIFI optical component 152 or 154 is in an engaged operative orientation during generation of RFIs 132, then that PIFI optical component 152 or 154 is in an engaged operative orientation during generation of MFIs 432.

Preferably, concurrently with the collection of reflected radiation 144 for the generation of MFI 432, metrology tool 120 additionally collects reflected radiation 144 with either S pupil receptor 148 or P pupil receptor 150, thereby generating a pupil image of at least one structure 436 formed on FPFSDW 122. Preferably, the at least one structure 436 is identical or nearly identical to the at least one structure 136. It is appreciated that during generation of the pupil image by S pupil receptor 148, PIFI optics 152 are in a disengaged operative orientation. Similarly, during generation of the pupil image by P pupil receptor 150, PIFI optics 154 are in a disengaged operative orientation.

It is appreciated that in an embodiment wherein S pupil receptor 148 is used to generate MFI 432, P pupil receptor 150 is used to generate the pupil image. Conversely, in an embodiment wherein P pupil receptor 150 is used to generate MFI 432, S pupil receptor 148 is used to generate the pupil image.

Preferably, each of system 100 and system 110 is operative to generate a quality metric of the FPFSDW 122, using the MSL 434 and the corresponding pupil image of the at least one structure formed on FPFSDW 122. It is appreciated that the "at least one structure formed on FPFSDW 122" is also referred to herein as "at least one FPFSDW structure" and as "measurement structures."

Figure 5:
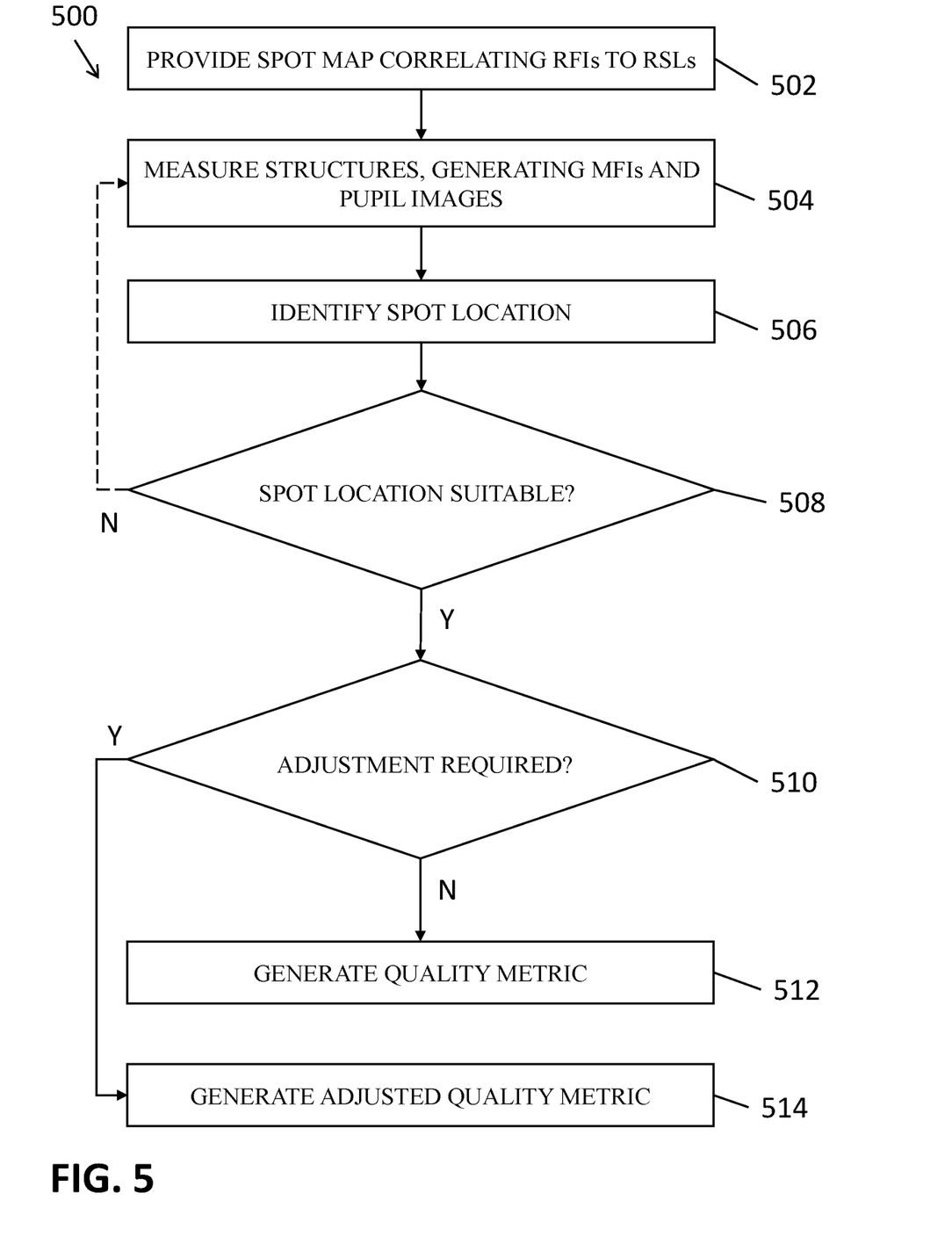
FIG. 5 is a simplified flowchart illustrating a preferred embodiment of a method for use with the systems of FIGS. 1A-2B.

Reference is now made to FIG. 5, which is a simplified flowchart illustrating a method 500 for measuring FPFSDW 122, for use with each of system 100 and system 110. As described hereinabove, method 500 is preferably part of a manufacturing process for semiconductor devices. It is appreciated that the illustrated portion of method 500 typically begins after the formation of at least one, and more typically after the formation of at least two, layers on SDW 122.

Preferably, prior to a start of method 500, as described hereinabove with reference to FIGS. 1A-3C, a spot map is generated by SMG 130, thereby correlating RFIs 132 to corresponding plurality of RSLs 134 on at least one reference structure 136 formed on RSDW 122, and the spot map is provided at a first step 502.

At a next step 504, as described hereinabove with reference to FIGS. 1A-4C, metrology tool 120 preferably measures at least a portion of at least one FPFSDW structure 436 formed on FPFSDW 122, thereby generating both MFI 432 of at least a portion of at least one FPFSDW structure 436 and a pupil image of the at least a portion of at least one FPFSDW structure 436. As described in more detail hereinabove, in one embodiment of the present invention, MFI 432 is generated using dedicated TA receptor 146. In another embodiment of the present invention, MFI 432 is generated using a pupil receptor, preferably one of S pupil receptor 148 and P pupil receptor 150, as described in more detail hereinabove.

As described hereinabove with particular reference to FIGS. 4A-4C, at a next step 506, FILME 240 preferably identifies MSL 434 on at least one FPFSDW structure 436, using MFI 432 generated at step 504 and the spot map provided at step 502. In one embodiment of the present invention, as described in more detail hereinabove, at least one FPFSDW structure 136 includes a plurality of periodic structures being periodic along axis of periodicity 490, and MSL 434 identified at step 506 indicates a distance in a direction generally parallel to axis of periodicity 490. Similarly, in such an embodiment, RSLs 132 each indicates a distance in a direction generally parallel to axis of periodicity 230.

At a next step 508, a determination is made to ascertain whether or not MSL 434 is suitable for use in generating a quality metric. Typically, a suitable MSL 434 is an MSL 434 having a corresponding MFI 432 that can be suitably matched to an RFI 132 in the spot map provided at step 502. Conversely, an unsuitable MSL 434 or not suitable MSL 434 is typically an MSL 434 having a corresponding MFI 432 that cannot be suitably matched to an RFI 132 in the spot map provided at step 502.

In one embodiment of the present invention, if MSL 434 is not suitable, for example, if MSL 434 is embodied as MSL 474 or 484 of FIGS. 4B & 4C, respectively, method 500 returns to step 504 and repeats steps 504 and 506 for at least one additional MSL 434. Alternatively, as described in more detail hereinabove, if MSL 434 is not suitable, then the results of the measurement taken at step 504 are flagged for a user to review, and method 500 proceeds to a next step 510.

If MSL 434 is suitable, for example, if MSL 434 is embodied as MSL 464 of FIG. 4A, at next step 510, a determination is made of whether or not a quality metric to be calculated using the pupil image generated at step 504 at MSL 434 will require adjustment based on the MSL 434 identified at step 506. If no adjustment is required, at a next step 512, a quality metric of FPFSDW 122 is generated, using the pupil image generated at step 504 and MSL 434 identified at step 506. If at step 510, it is ascertained that adjustment is required, at a next step 514, an adjusted quality metric of FPFSDW 122 is generated, using the pupil image generated at step 504, MSL 434 identified at step 506 and a suitable adjustment.

For example, a measurement of reference structures 136 may be known to produce a misregistration value including location-based noise of 1 nm/1 μm, where 1 μm represents a shift in the spot location from a reference point. In such a case, if calculations based on the pupil image generated at step 504 would typically generate a misregistration value of 1 nm, and the MSL 434 identified at step 506 indicates a shift of 0.1 μm from the reference point, then at step 514, an adjustment of (0.1 μm)*(1 nm/1 μm) is applied to the misregistration value of 1 nm, and method 500 provides an adjusted misregistration value of 1.1 nm, based on the pupil image generated at step 504, which generates a misregistration of 1 nm, and the suitable adjustment for MSL 434 identified at step 506, which is 0.1 nm.

As described hereinabove, in a preferred embodiment of the present invention, the at least one quality metric is an indication of misregistration between at least two layers formed on FPFSDW 122, particularly a misregistration value for the different layers between which misregistration was measured at measurement site 126. In an additional preferred embodiment of the present invention, the quality metric indicates at least one of a dimension or a shape of one or more structures formed within measurement site 126.

As described hereinabove, in a preferred embodiment of the present invention, the quality metric generated at step 512 or 514 is used in a fabrication process of a semiconductor device wafer. In one embodiment of the present invention, the quality metric generated at step 512 or 514 is used to generate an adjusted set of fabrication parameters, and the adjusted set of fabrication parameters are used to fabricate at least one layer of a semiconductor device wafer, thereby ameliorating at least one characteristic, such as misregistration between layers thereof or at least one of a dimension or a shape of one or more structures formed within measurement site 126. In another embodiment of the present invention, the quality metric generated at step 512 or 514 is used to determine that at least one characteristic of SDW 122, such as misregistration between layers thereof or at least one of a dimension or a shape of one or more structures formed within measurement site 126, is within a predetermined tolerance, and the fabrication thereof continues without adjustment due to method 500.

Figure 6:
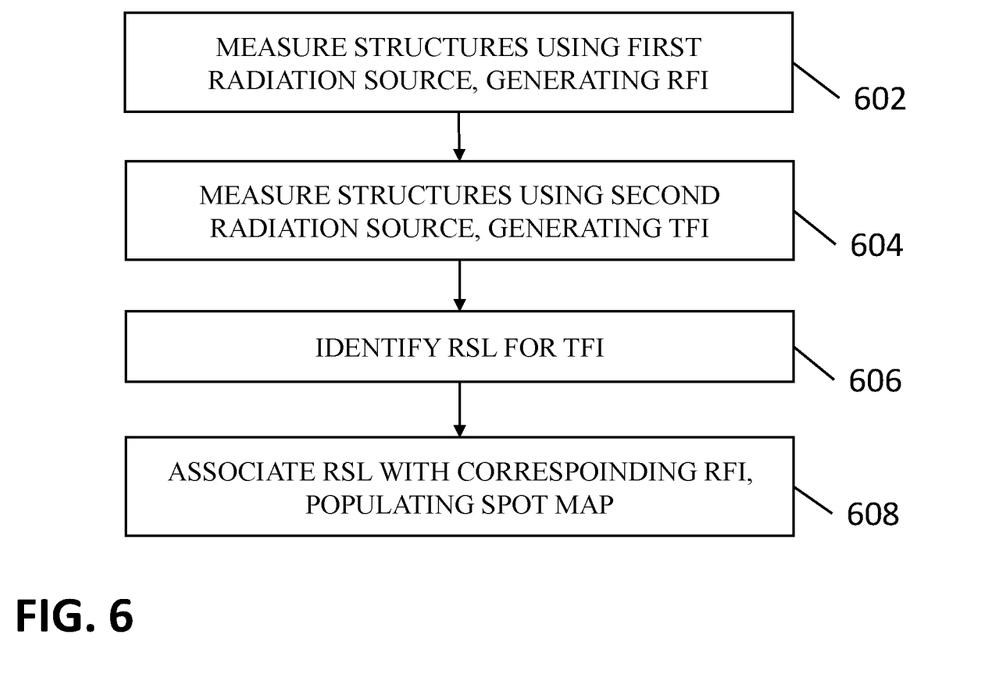
FIG. 6 is a simplified flowchart illustrating a preferred embodiment of a method for use with the systems of FIGS. 1A-2B and with the method of FIG. 5.

Reference is now made to FIG. 6, which is a simplified flowchart illustrating a preferred embodiment of a generation of the spot map which is provided at step 502 of method 500. Preferably, the steps illustrated in FIG. 6 are performed for each of a plurality of locations, preferably RSLs 132, on at least one reference structure 136.

At a first step 602, metrology tool 120 preferably generates RFI 132 from a first measurement of at least one reference structure 136 using first radiation source 142. It is appreciated that RFI 132 generated at step 602 is one of plurality of RFIs 132. As described in more detail hereinabove, in a preferred embodiment of the present invention, first radiation source 142 preferably provides generally coherent radiation 140.

At a next step 604, metrology tool 120 preferably generates a TFI from a second measurement of at the least one reference structure 136 using second radiation source 242. As described in more detail hereinabove, second radiation source 242 preferably provides generally incoherent light. Additionally, as described in more detail hereinabove, the TFI is generated by metrology tool 120 while metrology tool 120 and SDW 122 are in the same relative position as for the generation of RFI 132 at step 602. Most preferably, for each RSL 134, steps 602 and 604 are performed consecutively. However, in another preferred embodiment of the present invention, step 604 precedes step 602 for some or all of RSLs 134.

At a next step 606, SMG 130 preferably identifies, at least partially based on the TFI generated at step 604, a corresponding RSL 134 on at least one reference structure 136. It is appreciated that the corresponding RSL 134 identified at step 606 is one of plurality of RSLs 134.

At a next step 608, SMG 130 preferably populates the spot map by associating the corresponding RSL 134 identified at step 606 with the RFI 132 generated at step 602. It is appreciated that the spot map may be populated using any suitable method, including, inter alia, image processing and supervised or unsupervised machine learning. Examples of such suitable methods include, but are not limited to, blob detection, pattern recognition and non-linear image registration.

Preferably, steps 602, 604, 606 and 608 are repeated for a plurality of RSLs 134, including all suitable RSLs 134 for reference structures 136 at measurement site 126.

It is appreciated that for any set of RSLs 134 within a given range, the given range being preferably less than 30 nm, more preferably less than 20 nm, even more preferably less than 15 nm and most preferably less than 10 nm, the RFIs 132 of a corresponding set of RFIs 132 are generally indistinguishable from one another. Therefore, in order to include all suitable RSLs 134 in the spot map, a total length of reference structures 136 is preferably divided by the given range, producing a multiplicity of resulting regions, and metrology tool 120 preferably measures at least one RSL 134 in each of the resulting regions. Thus, it is appreciated that metrology tool 120 takes a finite number of measurements in order for SMG 130 to generate a spot map containing every possible suitable RFI 132 for reference structures 136.

Various steps, functions, and/or operations of systems and the methods disclosed herein can be carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor or, alternatively, multiple processors. Moreover, different sub-systems of the system may include one or more computing or logic systems. Therefore, the above description should not be interpreted as a limitation on the present disclosure but merely an illustration.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

What is claimed is:

1. A method for generating a quality metric relating to a fully or partially fabricated semiconductor device wafer (FPFSDW), the method comprising:
   providing a spot map correlating a plurality of reference field images (RFIs) to a corresponding plurality of reference spot locations (RSLs) on at least one reference structure formed on a reference semiconductor device wafer;
   taking a measurement of at least a portion of at least one FPFSDW structure formed on said FPFSDW, thereby generating:
      a measurement field image (MFI) of at least a portion of said at least one FPFSDW structure; and
      a pupil image of said at least a portion of said at least one FPFSDW structure;
   identifying, for said measurement, a measurement spot location (MSL) on said at least one FPFSDW structure, using said MFI and said spot map; and
   generating a quality metric of said FPFSDW, using said pupil image and said MSL.

2. The method according to claim 1, wherein said quality metric comprises an indication of misregistration between at least two layers formed on said FPFSDW.

3. The method according to claim 1, wherein said providing said spot map comprises:
   for each of a plurality of locations on said at least one reference structure:
      generating an RFI from a first measurement of said at least one reference structure using a first radiation source, said RFI being one of said plurality of RFIs;
      generating a training field image (TFI) from a second measurement of said at least one reference structure using a second radiation source;
      identifying, based on said TFI, a corresponding RSL on said at least one reference structure, said corresponding RSL being one of said plurality of RSLs; and
      populating said spot map by associating said corresponding RSL with said RFI.

4. The method according to claim 3, wherein said first radiation source provides generally coherent radiation, and said second radiation source provides generally incoherent radiation.

5. The method according to claim 1, wherein said generating said MFI comprises using a dedicated target acquisition receptor.

6. The method according to claim 1, wherein said generating said MFI comprises using a pupil receptor and at least one pupil image-to-field image optical component.

7. The method according to claim 1, if said MSL does not comprise a suitable spot location, further comprising, prior to said generating said quality metric:
   taking an additional measurement of at least a portion of said at least one FPFSDW structure, thereby generating:
      an additional MFI of at least a portion of said at least one FPFSDW structure; and
      an additional pupil image of said at least a portion of said at least one FPFSDW structure; and
   identifying, for said additional measurement, an additional MSL on said at least one FPFSDW structure, using said additional MFI and said spot map.

8. The method according to claim 1, wherein said at least one FPFSDW structure comprises a plurality of periodic structures being periodic along an axis of periodicity, and each of said RSLs and said MSL indicates a distance in a direction generally parallel to said axis of periodicity.

9. The method according to claim 1, further comprising using said quality metric in a fabrication process of at least one semiconductor device wafer.

10. A system for use with a metrology tool operative to measure a fully or partially fabricated semiconductor device wafer (FPFSDW), the system comprising:
   a spot map generator operative to generate a spot map correlating a plurality of reference field images (RFIs) to a corresponding plurality of reference spot locations (RSLs) on at least one reference structure formed on a reference semiconductor device wafer; and
   a field image-location mapping engine (FILME) operative to correlate each of a plurality of measurement field images (MFIs) with a corresponding measurement spot location (MSL) on at least one FPFSDW structure formed on said FPFSDW, using said spot map.

11. The system according to claim 10, wherein said system is operative to generate a quality metric of said FPFSDW using said MSL and a corresponding pupil image of said at least one FPFSDW structure.

12. The system according to claim 11, wherein said quality metric comprises an indication of misregistration between at least two layers formed on said FPFSDW.

13. The system according to claim 10, wherein said at least one FPFSDW structure comprises a plurality of periodic structures being periodic along an axis of periodicity, and each of said RSLs and said MSL indicates a distance in a direction generally parallel to said axis of periodicity.

14. The system according to claim 10, wherein said each of said plurality MFIs is generated using a source of generally coherent radiation.

15. A system for measuring a fully or partially fabricated semiconductor device wafer (FPFSDW), the system comprising:
   a metrology tool comprising:
      a first radiation source; and
      a second radiation source;
   a spot map generator operative to populate a spot map correlating a plurality of reference field images (RFIs) to a corresponding plurality of reference spot locations (RSLs) on at least one reference structure formed on a reference semiconductor device wafer; and
   a field image-location mapping engine (FILME) operative to correlate each of a plurality of measurement field images (MFIs) with a corresponding measurement spot location (MSL) on at least one FPFSDW structure formed on said FPFSDW, using said spot map.

16. The system according to claim 15, wherein said first radiation source provides generally coherent radiation, and said second radiation source provides generally incoherent radiation.

17. The system according to claim 15, wherein said spot map generator populates said spot map by:
   for each of a plurality of locations on said at least one reference structure:
      receiving an RFI from a first measurement of said at least one reference structure using a first radiation source, said RFI being one of said plurality of RFIs;
      receiving a training field image (TFI) from a second measurement of said at least one reference structure using a second radiation source;
      identifying, based on said TFI, a corresponding RSL on said at least one reference structure, said corresponding RSL being one of said plurality of RSLs; and
      populating said spot map by associating said corresponding RSL with said RFI.

18. The system according to claim 15, wherein said plurality of MFIs are generated by respective measurements of said FPFSDW taken under illumination by said first radiation source.

19. The system according to claim 15, wherein said metrology tool further comprises:
   a first radiation receptor operative to capture a pupil image; and
   a second radiation receptor operative to capture a field image.

20. The system according to claim 15, wherein said second radiation receptor comprises a dedicated target acquisition receptor.

21. The system according to claim 15, wherein said second radiation receptor comprises a pupil receptor.

22. The system according to claim 21, wherein said metrology tool further comprises at least one pupil image-to-field image optical component.

23. The system according to claim 15, wherein said system is operative to generate a quality metric of said FPFSDW using said MSL and a corresponding pupil image of said at least one FPFSDW structure.

24. The system according to claim 23, wherein said quality metric comprises an indication of misregistration between at least two layers formed on said FPFSDW.

25. The system according to claim 15, wherein said at least one FPFSDW structure comprises a plurality of periodic structures being periodic along an axis of periodicity, and each of said RSLs and said MSL indicates a distance in a direction generally parallel to said axis of periodicity.

* * * * *